US006884568B2

(12) United States Patent
Timpe et al.

(10) Patent No.: US 6,884,568 B2
(45) Date of Patent: Apr. 26, 2005

(54) STABILIZED INFRARED-SENSITIVE POLYMERIZABLE SYSTEMS

(75) Inventors: Hans-Joachim Timpe, Baumhofstr (DE); Tobias Wittig, An der Bahn (DE); Ursula Müller, Juessweg (DE)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 386 days.

(21) Appl. No.: 10/131,866

(22) Filed: Apr. 25, 2002

(65) Prior Publication Data

US 2002/0197564 A1 Dec. 26, 2002

Related U.S. Application Data

(63) Continuation-in-part of application No. 09/832,989, filed on Apr. 11, 2001, now abandoned.

(51) Int. Cl.$^7$ .......................... B41C 1/10; G03F 7/038; G03F 7/11; G03F 7/30

(52) U.S. Cl. ................. 430/284.1; 430/944; 430/287.1; 430/908; 430/302; 430/906; 430/281.1

(58) Field of Search .......................... 430/281.1, 282.1, 430/283.1, 284.1, 285.1, 286.1, 287.1, 288.1, 302, 309

(56) References Cited

U.S. PATENT DOCUMENTS

| | | | | |
|---|---|---|---|---|
| 4,410,621 A | | 10/1983 | Wada et al. | 430/281 |
| 4,937,159 A | | 6/1990 | Gottschalk et al. | 430/138 |
| 6,309,792 B1 | | 10/2001 | Hauck et al. | 430/270.1 |
| 6,326,123 B1 | | 12/2001 | West et al. | 430/270.1 |
| 6,352,811 B1 | | 3/2002 | Patel et al. | |
| 2002/0001771 A1 | | 1/2002 | Yates et al. | 430/270.1 |
| 2002/0025489 A1 | | 2/2002 | Shimada et al. | 430/270.1 |
| 2003/0003399 A1 | * | 1/2003 | Muller et al. | 430/287.1 |
| 2003/0129523 A1 | * | 7/2003 | Matsumoto et al. | 430/138 |
| 2003/0157433 A1 | * | 8/2003 | Timpe et al. | 430/273.1 |

FOREIGN PATENT DOCUMENTS

| | | | | |
|---|---|---|---|---|
| EP | 889363 | | 1/1999 | |
| JP | 11038633 A | | 2/1999 | |
| JP | 2000-86670 A | | 3/2000 | |
| WO | WO 00/48836 A1 | * | 8/2000 | B41C/1/10 |

OTHER PUBLICATIONS

JP 2000–86670A Abstract and partial machine translation.

JP 11038633A Abstract and partial machine translation.

* cited by examiner

*Primary Examiner*—Cynthia Hamilton
(74) *Attorney, Agent, or Firm*—RatnerPrestia

(57) ABSTRACT

The use of certain mercapto compounds as shelf life improvers for infrared-sensitive lithographic printing plate precursors is disclosed. The compounds are five-membered heteroaromatic rings containing a nitrogen atom and at least one other heteroatom, which can be oxygen, sulfur, or another nitrogen atom, such that two ring heteroatoms are bonded to a ring carbon bearing a thiol group.

26 Claims, No Drawings

STABILIZED INFRARED-SENSITIVE POLYMERIZABLE SYSTEMS

CROSS-REFERENCE TO RELATED APPLICATIONS

This application is a continuation in part of U.S. Pat. appln. Ser. No. 09/832,989 filed Apr. 11, 2001, now abandoned which is incorporated herein by reference. U.S. Pat. No. 6,309,792 B1 is also incorporated herein by reference.

FIELD OF THE INVENTION

This invention relates to lithographic printing plates. More particularly, this invention relates to infrared-sensitive lithographic printing plate precursors having good shelf life.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

A class of imageable elements called printing plate precursors, useful for making lithographic printing plates, comprises a photosensitive layer over the hydrophilic surface of a substrate. The photosensitive layer comprises one or more radiation-sensitive components, which may be dispersed in a suitable binder. Alternatively, the radiation-sensitive component can be the binder material itself.

If after exposure to radiation, the exposed regions of the photosensitive layer are removed in the developing process, revealing the underlying hydrophilic surface of the substrate, the element is referred to as positive working. Conversely, if the unexposed regions are removed by the developing process, the element is negative working. In each instance, the regions of the radiation-sensitive layer that remain (i.e., the image areas) are ink-receptive, and the regions of the hydrophilic surface revealed by the developing process accept water, typically a fountain solution, and repel ink.

Direct digital imaging of offset printing plates, which obviates the need for exposure through a negative, is becoming increasingly important in the printing industry. High-performance lasers or laser diodes, which are typically used to image these plates, emit radiation between 800 and 1100 nm. Therefore, printing plate precursors that are to be imaged by these radiation sources must be sensitive to radiation in this wavelength region. Such printing plate precursors may be handled in ambient light, which significantly facilitates their production, handling and processing.

Negative working lithographic printing plate precursors which can be imagewise exposed with infrared lasers are described for example in EP-A-0 672 544; EP-A-0 672 954; DeBoer, U.S. Pat. No. 5,491,046; and EP-A-0 819 985. However, the usefulness of these printing plate precursors is restricted by their shelf life, when stored in a hot and/or humid atmosphere. This shelf life issue makes plates usable in some cases for only one month or less. Thus, a need exists for negative working printing plate precursors with a longer shelf live.

SUMMARY OF THE INVENTION

The invention is an infrared-sensitive composition comprising:

(i) an initiator system comprising:

(a) at least one compound capable of absorbing infrared radiation, the compound selected from the group consisting of triarylamine dyes, thiazolium dyes, indolium dyes, oxazolium dyes, cyanine dyes, polyaniline dyes, polypyrrole dyes, polythiophene dyes, and phthalocyanine pigments, (b) at least one compound capable of producing free radicals, the compound selected from polyhaloalkyl-substituted compounds, and (c) at least one carboxylic acid represented by formula (I):

$$R^4—(CR^5R^6)_n—Y—CH_2COOH \qquad (I)$$

in which:

Y is selected from the group consisting of O, S and $NR^7$;

$R^7$ is selected from the group consisting of hydrogen, $C_1$–$C_6$ alkyl, —$CH_2CH_2OH$, and $C_1$–$C_5$ alkyl substituted with —COOH;

$R^4$, $R^5$ and $R^6$ are each independently selected from the group consisting of hydrogen, $C_1$–$C_4$ alkyl, substituted or unsubstituted aryl, —COOH and —$NR^8CH_2COOH$;

$R^8$ is selected from the group consisting of —$CH_2COOH$, —$CH_2OH$, and —$(CH_2)_2N(CH_2COOH)_2$; and n is 0, 1, 2or 3;

(ii) at least one component selected from unsaturated free radical-polymerizable monomers, unsaturated oligomers that are free radical-polymerizable, polymers containing free radical-polymerizable carbon-carbon double bonds in one or both of the backbone and a side chain, and mixtures thereof;

(iii) at least one polymeric binder; and (iv) a heterocyclic mercapto compound comprising an aromatic 5-membered heterocyclic ring with a thiol group substituted thereon, the ring comprising a nitrogen atom and at least one heteroatom selected from the group consisting of nitrogen, oxygen and sulfur, in which the heteroatom is separated in the ring from the nitrogen atom by one carbon atom, and in which the thiol group is bonded to the carbon atom;

in which:

$$ox_a < red_b + 1.6\ eV,$$

in which $ox_a$ is the oxidation potential of component (a) in eV, and $red_b$ is the reduction potential of component (b) in eV.

In another aspect, the invention is a printing plate precursor comprising a substrate and a layer of the infrared-sensitive composition over the substrate.

In yet another aspect, the invention is a method for forming an image useful as a lithographic printing plate by imagewise exposing the precursor to infrared radiation to form an imagewise-exposed precursor comprising exposed and unexposed regions in the layer of infrared sensitive composition, and developing the imagewise-exposed precursor with a developer to remove the unexposed regions.

Optionally, the exposed precursor may be briefly heated prior to developing, in order to effect increased curing in the exposed areas.

In still another aspect, the invention is a printing plate formed by imagewise exposing and then developing the precursor.

In a preferred embodiment of this invention, the printing plate precursor additionally comprises a substantially oxygen-impermeable barrier layer on an outer surface of the layer of infrared-sensitive composition.

Without wishing to be bound by any particular theory, and recognizing that the exact mechanism for the stabilization is not known with certainty, it is presently believed that in order to achieve both a high degree of radiation sensitivity and a high storage stability, the presence of all components is indispensable. If any of the infrared-absorbing compound (a), the polyhaloalkyl-substituted compound (b), or the carboxylic acid (c) is missing, only very radiation-insensitive plate precursors are obtained. The exclusion of the heterocyclic mercapto compound (iv) results in less storage stable compositions, but the radiation sensitivity is not significantly influenced by the presence or absence of (iv) when all of the components (a), (b), and (c) of the initiator system are present.

DETAILED DESCRIPTION OF THE INVENTION

Heterocyclic mercapto compounds afford significant and useful increases in the storage stability at higher temperatures of infrared-sensitive compositions and the printing plate precursors made from them, under both dry and humid storage conditions. Unlike compositions that do not contain these compounds, these compositions retain good infrared exposure sensitivity and the ability to resolve fine image features.

As used herein "alkyl" includes straight chain, branched chain, and cyclic alkyl groups unless otherwise defined. "Aryl" refers to carbocyclic aromatic groups and heterocyclic aromatic groups in which one or more heteroatoms independently selected from N, O and S are present in the aromatic ring. Examples of carbocyclic aromatic groups are phenyl and naphthyl. Examples of heterocyclic aromatic groups are 2-pyridyl and 4-pyridyl. "Substituted or unsubstituted aryl" refers to an aryl group as defined above that optionally comprises one or more substituents independently selected from the group consisting of —COOH, —OH, $C_1$–$C_6$ alkyl, —$NH_2$, halogen (i.e. fluorine, chlorine, bromine and iodine), $C_1$–$C_4$ alkoxy, acetamido, —$OCH_2COOH$, —$NHCH_2COOH$ and aryl.

"Total solids" refers to the amount of non-volatile material present in the composition, even though some of the materials present in the composition may be liquids at room temperature. Unless otherwise indicated "heterocyclic mercapto compound," "initiator system," "carboxylic acid," "polymeric binder" and similar terms also refers to mixtures of such compounds or components.

Infrared-sensitive Composition

The infrared-sensitive compositions comprise a heterocyclic mercapto compound, an infrared-sensitive initiator system, a free radical-polymerizable component, and a polymeric binder.

Heterocyclic Mercapto Compound

The composition comprises a heterocyclic mercapto compound or a mixture of heterocyclic mercapto compounds. Useful heterocyclic mercapto compounds include compounds comprising an aromatic 5-membered heterocyclic ring bearing a thiol substituent, where the ring comprises a nitrogen atom and either at least one other nitrogen atom, or an oxygen atom or a sulfur atom, in which the sulfur, oxygen or second nitrogen is separated from the first nitrogen by one carbon atom, which bears the thiol group. Suitable heterocyclic mercapto compounds include, for example, 3-mercapto-1,2,4-triazole; 3-mercapto-4-methyl-4H-1,2,4-triazole; 3-mercapto-5-(4-pyridyl)-1H-1,2,4-triazole; 2-mercaptobenzimidazole; 2-mercaptobenzoxazole; 2-mercaptobenzothiazole; 6-ethoxy-2-mercaptobenzothiazole; 2-mercapto-5-methyl-1,3,4-thiadiazole; 2-mercapto-5-phenyl-1,3,4-oxadiazole; 2-mercapto-5-(4-pyridyl)-1,3,4-oxadiazole; 5-mercapto-3-methylthio-1,2,4-thiadiazole; 2-mercapto-5-methylthio-1,3,4-thiadiazole; 2-mercaptoimidazole; 2-mercapto-1-methylimidazole; 5-mercapto-1-methyl-1H-tetrazole; and 5-mercapto-1-phenyl-1H-tetrazole. Preferred heterocyclic mercapto compounds include 3-mercapto-1,2,4-triazole; 2-mercaptobenzimidazole; 2-mercaptobenzoxazole; 5-mercapto-3-methylthio-1,2,4-thiadiazole; and 2-mercapto-1-methylimidazole.

The infrared-sensitive compositions preferably comprise about 0.5 to about 10 wt %, preferably about 2 to about 5 wt %, of the heterocyclic mercapto compound or mixture of heterocyclic mercapto compounds, based on the total solids of the infrared-sensitive composition.

Infrared-Sensitive Initiator System

The infrared-sensitive initiator system comprises an infrared absorbing compound, a free radical-producing compound, and a carboxylic acid.

Infrared Absorbing Compound

Useful infrared absorbing compounds typically have an absorption maximum between about 750 nm and about 1200 nm; more typically between about 800 nm and about 1100 nm. The infrared absorbing compound, (a), is selected from triarylamine dyes, thiazolium dyes, indolium dyes, oxazolium dyes, cyanine dyes, polyaniline dyes, polypyrrole dyes, polythiophene dyes and phthalocyanine pigments.

A preferred group of dyes are cyanine dyes. More preferred are cyanine dyes of the formula (A):

(A)

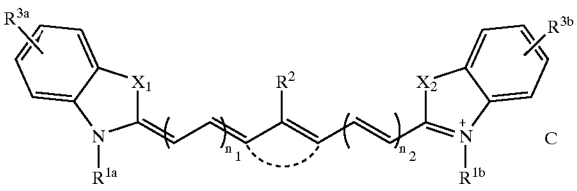

in which:

- $X_1$ and $X_2$ are each independently S, O, NR or C(alkyl)$_2$;
- $R^{1a}$ and $R^{1b}$ are each independently an alkyl group, an alkylsulfonate group, an alkylcarboxylate group or an alkylammonium group;
- $R^2$ is hydrogen, halogen, SR, $SO_2R$, OR or $NR_2$;
- $R^{3a}$ and $R^{3b}$ are each independently a hydrogen atom, an alkyl group, COOR, OR, SR, $NR_2$, a halogen atom, or a substituted or unsubstituted benzofused ring;
- R is an alkyl group or an aryl group;
- C is a counterion present in sufficient amount to achieve charge neutrality for cyanine dye (A);

is either two hydrogen atoms or a two-carbon or three-carbon chain; and

- $n_1$ and $n_2$ are each independently 0, 1, 2 or 3.

These cyanine dyes absorb in the range of 750 nm to 1100 nm. Dyes of the formula (A) that absorb in methanolic solutions in the range of 790 nm to 850 nm are preferred.

$X_1$ and $X_2$ are each preferably a C(alkyl)$_2$ group. $R^{1a}$ and $R^{1b}$ are each preferably an alkyl group with 1 to 4 carbon atoms. $R^2$ is preferably SR. $R^{3a}$ and $R^{3b}$ are each preferably a hydrogen atom. R is preferably a phenyl group.

The broken line represents the rest of an optional ring, preferably with 5 or 6 carbon atoms.

The counterion C will in some cases be a negative ion, in some cases a positive ion, and in some cases will not be needed at all, depending on the total charge contributed by $R^{1a}$ and $R^{1b}$. For instance, if $R^{1a}$ and $R^{1b}$ both bear a single negative charge, counterion C must bear a positive charge and be present at a level of one equivalent of counterion C per mole of cyanine dye (A). If instead $R^{1a}$ and $R^{1b}$ are both neutral alkyl groups, counterion C must bear a negative charge and be present at a level of one equivalent of counterion C per mole of cyanine dye (A). Other combinations of positively charged, negatively charged, and neutral embodiments of $R^{1a}$ and $R^{1b}$ are of course possible, and the required number of equivalents of counterion C can be readily determined by those skilled in the art.

If a negative counterion is needed, C is the conjugate base of a strong acid, such as trifluoromethanesulfonate, perfluorobutyrate, hexafluorophosphate, perchlorate, or a mixture of any of these. Preferably, C is chloride or tosylate.

If a positive counterion in needed, C is $Na^+$, $K^+$, $Li^+$, $NH4^+$, alkylammonium, or a mixture of any of these.

Especially preferred are infrared absorbing dyes with a symmetrical formula (A). Examples of such especially preferred dyes include:

2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride;

2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride;

2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate;

2-[2-[2-chloro-3-[2-ethyl-(3H-benzthiazole-2-ylidene)-ethylidene]-1-cyclohexen-1-yl]-ethenyl]-3-ethyl-benzthiazolium tosylate; and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate.

The following are also useful infrared absorbers:

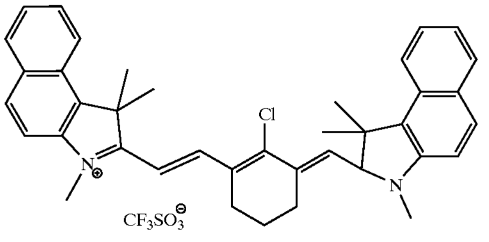

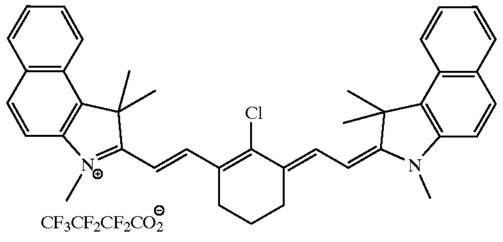

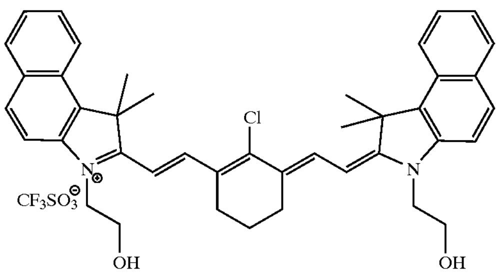

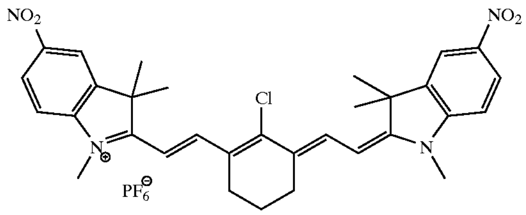

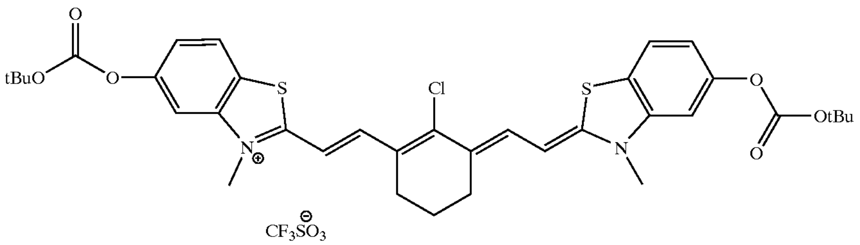

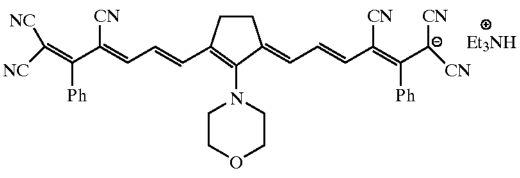

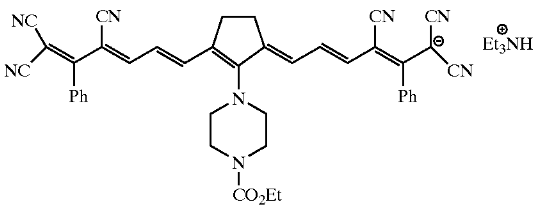

-continued

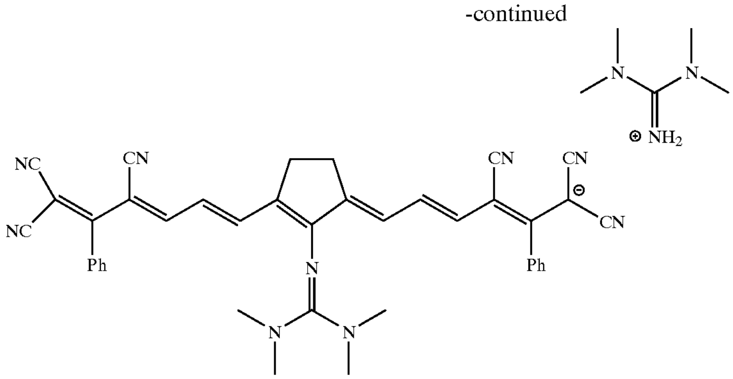

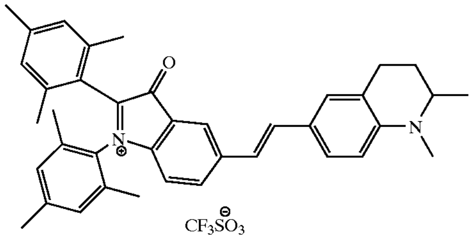

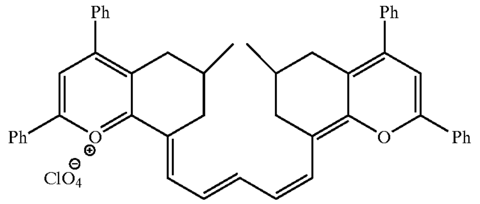

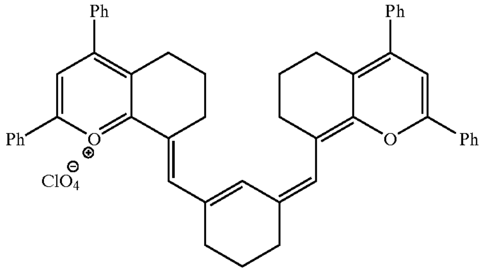

The infrared-sensitive composition preferably comprises about 0.5 to about 8 wt %, more preferably about 1 to about 3 wt % of the infrared absorber, based on the total solids of the infrared-sensitive composition.

Free Radical-Producing Compound

The initiator system comprises a compound or mixture of compounds capable of producing free radicals. The system comprises a polyhaloalkyl-substituted compound or a mixture of polyhaloalkyl-substituted compounds. These compounds comprise at least either one polyhalogenated or several monohalogenated or dihalogenated alkyl substituents. The halogenated alkyl group preferably has 1 to 3 carbon atoms. A preferred halogenated alkyl group is the halogenated methyl group.

Especially suitable polyhaloalkyl-substituted compounds include, for example:

2-(4-methoxyphenyl)-4,6-bis(trichloromethyl)-1,3,5-triazine;

2-(4-chlorophenyl)-4,6-bis(trichloromethyl)-1,3,5-triazine;

2-phenyl-4,6-bis(trichloromethyl)-1,3,5-triazine;

2,4,6-tris(trichloromethyl)-1,3,5-triazine;

2,4,6-tris(tribromomethyl)-1,3,5-triazine; and tribromomethyl phenylsulfone.

The infrared-sensitive composition preferably comprises about 2 to about 15 wt %, more preferably about 4 to about 7 wt %, based on the total solids of the infrared-sensitive composition, of the polyhaloalkyl-substituted compound or mixture of polyhaloalkyl-substituted compounds.

The absorption properties of the polyhaloalkyl-substituted compound determine the daylight stability of the infrared-sensitive composition. Compounds that have an ultraviolet/visible absorption maximum of >330 nm produce compositions that can not be completely developed after the printing plate precursor has been kept in daylight for 6 to 8 minutes and then heated prior to development. If a high degree of daylight stability is desired, polyhaloalkyl-substituted compounds that do not have significant ultraviolet/visible absorption at >330 nm are preferred.

The oxidation potential of the compound capable of absorbing infrared radiation, (a), should be less than the reduction potential of the polyhaloalkyl-substituted compound, (b), plus 1.6 eV.

Carboxylic Acid

The carboxylic acid (c) is represented by the following formula (I)

$$R^4—(CR^5R^6)_n—Y—CH_2COOH \quad (I)$$

in which:

Y is selected from the group consisting of O, S and $NR^7$, in which $R^7$ is selected from the group consisting of hydrogen, $C_1$–$C_6$ alkyl, —$CH_2CH_2OH$, and $C_1$–$C_5$ alkyl substituted with —COOH;

$R^4$, $R^5$ and $R^6$ are each independently selected from the group consisting of hydrogen, $C_1$–$C_4$ alkyl, substituted or unsubstituted aryl, —COOH and —$NR^8CH_2COOH$;

$R^8$ is selected from the group consisting of —$CH_2COOH$, —$CH_2OH$ and —$(CH_2)_2N(CH_2COOH)_2$; and n is 0, 1, 2 or 3.

Useful carboxylic acids are, for example:

(p-acetamidophenylimino)diacetic acid;
3-(bis(carboxymethyl)amino)benzoic acid;
4-(bis(carboxymethyl)amino)benzoic acid;
2-[(carboxymethyl)phenylamino]benzoic acid;
2-[(carboxymethyl)phenylamino]-5-methoxybenzoic acid;
3-[bis(carboxymethyl)amino]-2-naphthalenecarboxylic acid;
N-(4-aminophenyl)-N-(carboxymethyl)glycine;
N,N'-1,3-phenylenebisglycine;
N,N'-1,3-phenylenebis[N-(carboxymethyl)]glycine;
N,N'-1,2-phenylenebis[N-(carboxymethyl)]glycine;
N-(carboxymethyl)-N-(4-methoxyphenyl)glycine;
N-(carboxymethyl)-N-(3-methoxyphenyl)glycine;
N-(carboxymethyl)-N-(3-hydroxyphenyl)glycine;
N-(carboxymethyl)-N-(3-chlorophenyl)glycine;
N-(carboxymethyl)-N-(4-bromophenyl)glycine;
N-(carboxymethyl)-N-(4-chlorophenyl)glycine;
N-(carboxymethyl)-N-(2-chlorophenyl)glycine;
N-(carboxymethyl)-N-(4-ethylphenyl)glycine;
N-(carboxymethyl)-N-(2,3-dimethylphenyl)glycine;
N-(carboxymethyl)-N-(3,4-dimethylphenyl)glycine;
N-(carboxymethyl)-N-(3,5-dimethylphenyl)glycine;
N-(carboxymethyl)-N-(2,4-dimethylphenyl)glycine;
N-(carboxymethyl)-N-(2,6-dimethylphenyl)glycine;
N-(carboxymethyl)-N-(4-formylphenyl)glycine;
N-(carboxymethyl)-N-ethylanthranilic acid;
N-(carboxymethyl)-N-propylanthranilic acid;
N-(carboxymethyl)-N-benzylglycine;
5-bromo-N-(carboxymethyl)anthranilic acid;
N-(2-carboxyphenyl)glycine;
o-dianisidine-N,N,N',N'-tetraacetic acid;
4-carboxyphenoxyacetic acid;
catechol-O,O'-diacetic acid;
4-methylcatechol-O,O'-diacetic acid;
resorcinol-O,O'-diacetic acid;
hydroquinone-O,O'-diacetic acid;
α-carboxy-o-anisic acid;
4,4'-isopropylydenediphenoxyacetic acid;
2,2'-(dibenzofuran-2,8-diyldioxy)diacetic acid;
2-(carboxymethylthio)benzoic acid;
5-amino-2-(carboxymethylthio)benzoic acid;
3-[(carboxymethyl)thio]-2-naphthalenecarboxylic acid;
ethylene diamine tetraacetic acid;
nitrilo triacetic acid;
diethylene triamine pentaacetic acid;
N-hydroxyethyl ethylene diamine triacetic acid;
phenoxyacetic acid;
2,3-methoxyphenoxyacetic acid;
(phenylthio)acetic acid; and
(3,4-dimethoxyphenylthio)acetic acid.

A preferred group of carboxylic acids are N-arylpolycarboxylic acids, in particular those of formula (B)

(B)

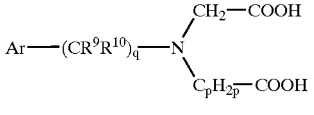

in which Ar is a mono-, poly- or unsubstituted aryl group, p is an integer from 1 to 5, $R^9$ and $R^{10}$ are independently selected from the group consisting of hydrogen and $C_1$–$C_4$ alkyl, and q is 0 or an integer from 1 to 3, and those of formula (C)

(C)

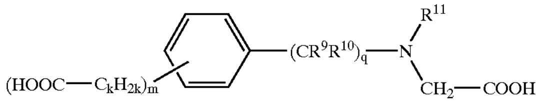

in which $R^{11}$ is hydrogen or a $C_1$–$C_6$ alkyl group, k and m are each independently an integer from 1 to 5, and $R^9$, $R^{10}$ and q are as defined above.

The aryl group in formula (B) may be substituted with one or more $C_1$–$C_3$ alkyl groups, $C_1$–$C_3$ alkoxy groups, $C_1$–$C_3$ thioalkyl groups and/or halogens. The aryl group can have 1 to 3 identical or different substituents.

p is preferably 1; Ar preferably is a phenyl group.

In formulae (B) and (C), groups $R^9$ and $R^{10}$ preferably are independently selected from hydrogen and methyl; more preferably $R^9$ and $R^{10}$ are both hydrogen. q is preferably 0 or 1. k and m are each preferably 1 or 2; $R^{11}$ is preferably hydrogen, methyl or ethyl.

The most preferred aromatic carboxylic acids are anilino diacetic acid, N-(carboxymethyl)-N-benzylglycine and (3,4-dimethoxyphenylthio)acetic acid.

The infrared-sensitive composition preferably comprises about 1 to about 10 wt %, more preferably about 1.5 to about 3 wt %, of the carboxylic acid, based on the total solids of the infrared-sensitive composition.

Free Radical-Polymerizable Component

Component (ii) is a free radical-polymerizable compound having at least one ethylenically unsaturated carbon-carbon double bond. It is selected from those compounds having at least one, and preferably two or more, terminal ethylenically unsaturated bonds. Such compounds are well known and widely employed in the art, and can be used without any particular limitation in this invention. As unsaturated free radical-polymerizable monomers or oligomers, use can be made of for example derivatives of acrylic acid, methacrylic acid, itaconic acid, crotonic acid, isocrotonic acid, maleic acid, and fumaric acid. Preferred are esters of acrylic or methacrylic acid in the form of monomers, oligomers or prepolymers. They may be present in solid or liquid form, with solid and highly viscous forms being preferred. The compounds suitable as monomers include for example trimethylol propane triacrylate and trimethacrylate, pentaerythritol triacrylate and trimethacrylate, dipentaerythritol monohydroxy pentaacrylate and pentamethacrylate, dipentaerythritol hexaacrylate and hexamethacrylate, pentaerythritol tetraacrylate and tetramethacrylate, di(trimethylol propane) tetraacrylate and tetramethacrylate, diethyleneglycol diacrylate and dimethacrylate, triethyleneglycol diacrylate and dimethacrylate, or tetraethyleneglycol diacrylate and dimethacrylate. Suitable oligomers and/or prepolymers are urethane acrylates and methacrylates, epoxide acrylates and methacrylates, polyester acrylates and methacrylates, polyether acrylates and methacrylates, and unsaturated polyester resins.

Besides monomers and oligomers, polymers having free radical-polymerizable carbon-carbon double bonds in the backbone and/or in side chains can be used. Examples include reaction products of maleic anhydride-olefin copolymers with hydroxyalkyl(meth)acrylates; polyesters comprising allyl alcohol ester groups; reaction products of polymeric polyalcohols with isocyanato (meth)acrylates; unsaturated polyesters; (meth)acrylate terminated polystyrenes, (meth)acrylate terminated poly(meth)acrylic acids, (meth)acrylate terminated poly(meth)acrylic esters, (meth)acrylate terminated poly(meth)acrylic amides and (meth)acrylate terminated polyethers. As used herein, the prefix "(meth)" preceding "acrylic" or "acrylate" indicates that either acrylic or methacrylic functionality can be used.

Preferred radical-polymerizable components are pentaerythritol tetraacrylate, dipentaerythritol pentaacrylate, di(trimethylol propane) tetraacrylate, diethyleneglycol diacrylate, prepolymers containing allyl alcohol ester groups, and oligomeric urethane (meth)acrylate.

The infrared-sensitive composition preferably comprises about 35 to about 60 wt %, more preferably about 45 to about 55 wt %, of the free radical-polymerizable component, based on the total solids of the infrared-sensitive composition.

Polymeric Binder

Binders useful for this invention are preferably linear organic polymers. Preferred binders are soluble or swellable in water or weakly alkaline aqueous solutions, which are commonly used as developers for lithographic printing plates. A large variety of polymers or polymer mixtures known in the art can be used as polymeric binders, for example acrylic acid copolymers, methacrylic acid copolymers, itaconic acid copolymers, crotonic acid copolymers, maleic acid copolymers, partially esterified maleic acid copolymers, and acidic cellulose derivatives. Preferably, the polymer has a weight-average molecular weight in the range of 10,000 to 1,000,000 (determined by gel permeation chromatography).

For good ink acceptance during the printing process, it is preferred that the polymer or polymer mixture have an acid number of >70 mg KOH/g. A polymer or polymer mixture with an acid number of >110 mg KOH/g is more preferred. Most preferred is a polymer or polymer mixture with an acid number between 140 and 160 mg KOH/g.

The infrared-sensitive composition preferably comprises about 30 to about 60 wt %, more preferably about 35 to about 45 wt %, based on the total solids of the infrared-sensitive composition, of the polymeric binder.

Other Ingredients

The infrared-sensitive composition may additionally comprise components that are conventional components of photopolymerizable compositions, such as plasticizers, fat-sensitizing agent and colorants, The infrared-sensitive composition may additionally comprise a plasticizer. Suitable plasticizers include, for example, dibutyl phthalate, triacetyl glycerine, triaryl phosphate, and dioctyl phthalate. When a plasticizer is present, the composition preferably comprises about 0.25 to about 2 wt % of the plasticizer, based on the total solids in the composition.

The infrared-sensitive composition may additionally comprise a colorant to aid in visual inspection of the exposed and developed plate precursor. This facilitates both visual detection of image defects, typographic errors, etc., and the use of an image densitometer. Suitable colorants are those that dissolve well in the solvent or solvent mixture used for coating or are easily introduced in the disperse form of a pigment. Typical examples include rhodamine dyes, triarylmethane dyes, anthraquinone pigments, azo type pigments and phthalocyanine dyes and/or pigments. When a colorant is present, the composition typically comprises about 0.5 wt % to about 3 wt % of the colorant.

To improve ink receptivity of the finished plate, the composition may also comprise a fat-sensitizing agent such as polymethyl methacrylates or polyvinyl acetates. When a fat-sensitizing agent or mixture of fat-sensitizing agents is present, the composition typically comprises about 2.0 wt % to about 8.0 wt % of the fat-sensitizing agent or mixture of fat sensitizing agents.

The infrared-sensitive composition may comprise a nonionic and/or amphoteric surfactant or mixture of such surfactants. Such surfactants improve both the coating properties (e.g. cosmetics of the plate precursor) and enhance the treatment stability under development conditions. Examples of suitable surfactants are sorbitan tristearate, glycerol monostearate, polyoxyethylene nonyl ether, alkyl di(aminoethyl) glycine, 2-alkyl-N-carboxyethylimidazolium betaine, and perfluoro compounds. When a surfactant or mixture of surfactants is present, the composition preferably comprises about 0.01 to about 1 wt %, more preferably about 0.05 to about 0.5 wt % of the surfactant or mixture of surfactants.

Printing Plate Precursor

The printing plate precursor comprises a layer of the infrared-sensitive composition over an appropriate substrate and optionally a substantially oxygen-impermeable barrier layer over the layer of infrared-sensitive composition.

Substrate

The infrared-sensitive composition may be applied to a wide variety of substrates. The substrate comprises a natural or synthetic support, preferably one that has been surface treated to improve adhesion of the infrared-sensitive composition and/or hydrophilicity of nonimage areas of the developed lithographic plate.

The substrate preferably is a strong, stable and flexible sheet. It should resist dimensional change under conditions of use so that color records will register in a full-color image. Typically, it can be any self-supporting material, including, for example, polymeric films such as polyethylene terephthalate film, ceramic sheet, metal sheet, or stiff paper, or a lamination of any of these materials. Metal substrates include aluminum, zinc, titanium, copper and alloys thereof, of which aluminum is preferred.

The particular substrate will generally be determined by the intended application. The infrared-sensitive compositions of this invention are especially suited for use in the production of lithographic printing plates.

For lithographic printing, the printing plate substrate comprises a support, which may be any material conventionally used to prepare lithographic printing plate precursors, with at least one hydrophilic surface. Aluminum foils and polymeric films are common printing plate substrate materials. Typically, the infrared-sensitive material forms a layer over a hydrophilic surface of the printing plate substrate.

The backside of the substrate (i.e., the side opposite the layer of infrared-sensitive material) may be coated with an antistatic agent and/or a slipping layer or matte layer to improve the handling and "feel" of the infrared-sensitive precursor.

If the printing plate substrate is aluminum, the surface may be treated by techniques known in the art, including physical graining, electrochemical graining, chemical graining, and anodizing. The substrate should be thick enough, typically about 100 to about 600 $\mu$m, to sustain the wear from printing and be thin enough to wrap around a printing form. Typically, the substrate comprises an interlayer between the aluminum support and the infrared-sensitive layer. The interlayer may be formed by coating the support with, for example, dextrin, hexafluorosilicic acid, a phosphate/fluoride mixture, polyvinyl phosphonic acid, a polyvinyl phosphonic acid copolymer, or a silicate, by means and with materials well known in the art.

Preparation of the Printing Plate Precursor

The precursor may be prepared by applying a layer of infrared-sensitive composition over the hydrophilic surface of the substrate using conventional coating or lamination methods. Typically the ingredients are dispersed or dissolved in a suitable coating solvent, and the resulting mixtures coated by conventional methods, such as spin coating, bar coating, gravure coating, roller coating, dip coating, air knife coating, hopper coating, blade coating, and spray coating. The term “coating solvent” includes mixtures of solvents, especially mixtures of organic solvents.

Selection of the solvents used to apply the infrared-sensitive layer depends on the exact identities and amounts of the initiator system, the polymerizable component(s), the binder(s), the mercapto compound(s), and the other ingredients, if any, present in the infrared-sensitive composition. A variety of conventional organic solvents can be used. However, for convenience during the drying process, solvents having a boiling point of between about 40° C. and about 160° C., preferably between about 60° C. and about 130° C., are typically used. The solids content of the coating solution is typically about 2 to about 25 wt %, based on the weight of the solvent.

Suitable organic solvents include, for example, alcohols such as methyl alcohol, ethyl alcohol, n- and iso-propyl alcohols, n- and iso-butyl alcohols and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methyl cyclohexanone, and acetyl acetone; polyhydric alcohols and derivatives thereof such as ethylene glycol, ethylene glycol monomethyl ether or its acetate, ethylene glycol monoethyl ether or its acetate, ethylene glycol diethylether, ethylene glycol monobutyl ether or its acetate, propylene glycol monomethyl ether or its acetate, propylene glycol monoethyl ether or its acetate, propylene glycol monobutyl ether, 3-methyl-3-methoxybutanol; and special solvents such as dimethylsulfoxide, N,N-dimethylformamide, methyl lactate, and ethyl lactate. These solvents may be used singly or in a mixture of two or more solvents. The amount of infrared-sensitive composition solution or dispersion applied during the coating process is preferably within a range about 10 mL/$m^2$ to about 100 mL/$m^2$.

Drying of the infrared-sensitive precursor is usually carried out using heated air. The air temperature is preferably between about 30° C. and about 200° C., more preferably between about 40° C. and about 120° C. The air temperature may be held constant during the drying process, or may be gradually stepped up. In some cases it may be beneficial to use a stream of air for moisture absorption. The heated air may preferably be blown over the layer at a rate of about 0.1 m/s to about 30 m/s, with values about 0.5 m/s to about 20 m/s being particularly desirable. Following drying, the coating weight of the infrared-sensitive layer is typically about 0.5 to about 4 g/$m^2$, preferably about 1 to about 3 g/$m^2$.

A conventional oxygen-impermeable barrier layer is preferably applied over the infrared-sensitive layer. Suitable materials for this purpose include, but are not limited to, polyvinyl alcohol, polyvinyl alcohol/polyvinyl acetate copolymers, polyvinyl pyrrolidone, polyvinyl pyrrolidone/polyvinyl acetate copolymers, polyvinyl methylether, polyacrylic acid, polyvinyl imidazole and gelatin. These polymers can be used alone or in combination. The dry layer weight of the oxygen-impermeable barrier layer is preferably about 0.1 to about 4 g/$m^2$, more preferably about 0.7 to about 2 g/$m^2$. This layer is not only useful as an oxygen barrier but also protects the plate precursor against ablation during exposure to infrared radiation. Further, the barrier layer improves the scratch resistance of the plate precursor, very important for ease of handling. The barrier layer can also contain coloring agents (water soluble dyes) which do not absorb in the wavelength region between 800 and 1100 nm, but are capable of efficiently absorbing in the visible light region, thereby improving the stability of the precursor toward accidental exposure by ambient light.

Imaging and Processing of the Plate Precursor

The thus obtained printing plate precursor is exposed with a semiconductor laser or laser diode which emits in the range of 800 to 1100 nm, using commercially available equipment. Such a laser beam can be digitally controlled via a computer; i.e. it can be turned on or off so that an imagewise exposure of the plate precursors can be effected via stored digitalized information in the computer. Therefore, the infrared-sensitive compositions of the present invention are suitable for preparing what is referred to as computer-to-plate (ctp) printing plate precursors, also known as digital plate precursors.

Upon imagewise exposure, the exposed regions of the infrared-sensitive composition are rendered not removable by a developer, while the unexposed regions remain removable. After the printing plate precursor has been imagewise exposed, it is optionally briefly heated to a temperature of about 85 to about 135° C. to cure the exposed regions. Depending on the temperature used, this takes about 20 to about 100 seconds.

Then the plate precursor is developed by methods commonly practiced in the art, typically with a commercially available aqueous alkaline developer, which removes the unexposed regions of the infrared-sensitive composition and leaves the exposed regions. The developed plate is usually treated with a preservative (“gumming”). The preservative is typically an aqueous solution of one or more hydrophilic polymers, wetting agents and other additives.

Industrial Applicability

The infrared-sensitive compositions may be used in a number of applications, including, but not limited to, recording materials for creating images on suitable carriers and receiving sheets, creating reliefs that may serve as printing plates, screens and the like, as etch resists, as radiation-curable varnishes for surface protection, and for the formulation of radiation-curable printing inks. While the compositions of this invention may be used in a number of applications, they are particularly useful for preparing negative-working lithographic printing plate precursors imageable by infrared radiation.

The advantageous properties of this invention can be observed by reference to the following examples, which illustrate but do not limit the invention.

EXAMPLES

| | Glossary |
|---|---|
| AC 50 | Methacrylic copolymer, acid number of 48 mg KOH/g, 70 wt % solution in ethylene glycol monomethyl ether (PCAS, Longjumeau, France) |
| AIRVOL ® 203 | Polyvinyl alcohol; 12 wt % residual acetyl groups (Air Products, Allentown, PA, USA) |
| DESMODUR ® N100 | Solvent-free, aliphatic triisocyanate resin containing biuret functionality (Bayer, Leverkusen, Germany). |
| JONCRYL ® 683 | Acrylic acid copolymer, acid number of 175 mg KOH/g (S.C. Johnson, Racine, WI, USA). |
| MOWIOL ® 4/88 | Polyvinyl alcohol Clariant; 12 wt % residual acetyl groups (Clariant International, Muttenz, Switzerland) |
| PVI | Polyvinyl imidazole (Panchim, Lisses, France) |
| RENOL ® Blue B2G HW | Copper phthalocyanine pigment preparation with polyvinyl butyral (Clariant International, Muttenz, Switzerland) |
| SCRIPSET ® 540 | Butyl half ester of maleic anhydride/styrene copolymer (Solutia, St. Louis, MO, USA) |
| Terpolymer | Terpolymer of 45 mol % styrene, 22 mol % methacrylic acid, and 33 mol % methyl methacrylate, with acid number of 130 mg KOH/g |
| Urethane acrylate | 80% Methylethylketone solution of a urethane acrylate obtained by reacting DESMODUR ® N100 with hydroxyethyl acrylate and pentaerythritol triacrylate, having a double bond content of 0.5 mole double bonds/100 g on a nonvolatiles basis after completion of the reaction of the isocyanate groups |

Example 1

A coating solution was prepared from the following components: 6.4 g of JONCRYL® 683; 8.0 g of AC 50; 2.6 g of dipentaerythritol pentaacrylate; 16.8 g of urethane acrylate; 0.8 g of anilino diacetic acid; 0.3 g of 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 1.5 g of 2-(4-methoxyphenyl)-4,6-bis(trichloromethyl)-1,3,5-triazine; 0.65 g of 3-mercapto-1,2,4-triazole; and 0.6 g of RENOL® Blue B2G HW. The components were dissolved under stirring in 200 mL of a mixture consisting of 90 parts by volume of 1-methoxy-2-propanol and 10 parts by volume of acetone.

After the solution was filtered, it was applied to an electrochemically grained and anodized aluminum foil that had been pretreated by standard methods with an aqueous solution of polyvinyl phosphonic acid, and the coating was dried for 4 min at 90° C. The dry weight of the resulting infrared-sensitive layer amounted to approximately 2 $g/m^2$.

Then, an oxygen-impermeable barrier layer having a dry weight of 2 $g/m^2$ was applied by coating with a solution of the following composition: 42.5 g of AIRVOL® 203; 7.5 g of PVI; and 170 g of water. Drying took place for 5 min at 90° C. Plate precursors prepared in this manner will be referred to as "fresh" plate precursors.

The thus prepared precursor was exposed using a Trendsefter™ 3244 from Creo/Scitex with a 830 nm laser diode. The UGRA/FOGRA Postscript Strip version 2.0 EPS (available from UGRA), which contains different image elements for evaluating the quality of the copies, was used for imaging.

The exposed precursor was processed in a MercuryNews processor (Kodak Polychrome Graphics LLC), equipped with a preheat section, a prewash section, an immersion type developing bath, a section for rinsing with water, and a gumming and a drying section. The processor was filled with developer 980 (Kodak Polychrome Graphics LLC). The following settings were used for processing of the plate precursor: speed 120 cm/min, preheat 630, prewash rate 0.5 $L/m^2$ plate, temperature of the developing bath (23±1)° C. After this treatment, the exposed portions remained on the plate while the unexposed portions were completely removed by the developer.

To evaluate the copy obtained after preheating and developing, the following criteria were examined: quality of the reproduction of the 1-pixel elements, optical density of the checkerboard dots of the pixel elements, and optical density of a solid element. For determination of color contrast and the density of solids and screen dots, a D19/D196 apparatus (Gretag/Macbeth Color Data Systems, The Wirral, UK) was used.

The results for energy requirements showed that for a good reproduction of the solids an exposure energy of 75 $mJ/cm^2$ and for 1-pixel elements one of 105 $mJ/cm^2$ was required.

A plate exposed with 105 $mJ/cm^2$ was mounted in a sheet-fed offset lithographic press and proofed. The image areas accepted ink without any problems and the paper copy did not showed any toning in the non-image areas. After 200,000 good impressions the printing was stopped, however, the plate could have been used for more prints.

For testing the shelf life of the plate precursors, they were subjected to rapid simulated aging. For that purpose, the precursors were in one case heated for 15 hours to a temperature of 60° C. in an incubator (hereinafter referred as "dry aged" plate precursors), and in another case stored for 7 days in a climate chamber having a temperature of 40° C. and a relative humidity of 80% (hereinafter referred as "wet aged" precursors). The infrared sensitivity and copy results of these precursors were then determined as described above. The unexposed areas of the precursors could be completely removed by the developer. The results for energy requirements showed that for a good reproduction of the solids, exposure energies of 85 $mJ/cm^2$ for dry aged precursor and 85 $mJ/cm^2$ for wet aged precursor were required. For a good reproduction of 1-pixel elements exposures of 118 $mJ/cm^2$ (dry aged) and 115 $mJ/cm^2$ (wet aged) were needed.

Plates made from both wet-aged and dry-aged precursors, exposed with energies required for a good reproduction of 1-pixel elements, were mounted in a sheet-fed offset lithographic press and proofed. The image areas accepted ink without any problems and the paper copies did not showed any toning in the non-image areas. After 200,000 good impressions the printing was stopped, however, the plates could have been used for more prints.

Example 2

Example 1 was repeated with the following coating solution: 2.5 g of SCRIPSET® 540; 0.55 g of dipentaerythritol pentaacrylate; 3.4 g of urethane acrylate; 0.18 g of anilino diacetic acid; 0.32 g of 2-[2-[2-chloro-3-[2-ethyl-(3H-benzthiazole)-2-ylidene]-1-cyclohexen-1-yl]-ethenyl]-3-rthyl-benzthiazolium tosylate; 0.32 g of tribromomethylphenylsulfone; and 0.15 g 2-mercaptobenzimidazole.

The results for energy requirements showed that for a good reproduction of the solids of a fresh precursor an exposure energy of 85 mJ/$cm^2$ and for 1-pixel elements one of 120 mJ/$cm^2$ was required. For a good reproduction of the solids, exposure energies of 95 mJ/$cm^2$ for dry aged precursor, and 100 mJ/$cm^2$ for wet aged precursor were required. For a good reproduction of 1-pixel elements exposures of 133 mJ/$cm^2$ (dry aged) and 140 mJ/$cm^2$ (wet aged) were needed. These results show that by changing the mercapto compound, the infrared dye, the polyhaloalkyl-compound and the polymeric binder the sensitivity parameters remain almost constant both for fresh and aged precursors.

Example 3

Example 1 was repeated except that 2-mercaptobenzoxazole was used instead of 3-mercapto-1,2,4-triazole in the infrared-sensitive layer. Then, an oxygen-impermeable barrier layer of 2 g/$m^2$ dry layer was coated from a solution of 50 g of MOWIOL® 4/88 in 170 g of water. The layer was dried for 5 min at 90° C.

The results for energy requirements showed that for a good reproduction of solids of a fresh precursor an exposure energy of 80 mJ/$cm^2$ and for 1-pixel elements one of 110 mJ/$cm^2$ was required. For a good reproduction of the solids, exposure energies of 90 mJ/$cm^2$ for dry aged precursor, and 90 mJ/$cm^2$ for wet aged precursor were required. For a good reproduction of 1-pixel elements, exposures of 125 mJ/$cm^2$ (dry aged) and 120 mJ/$cm^2$ (wet aged) were needed. These data show that by changing the mercapto compound and the layer composition the sensitivity parameters remain almost constant both for fresh and aged precursors.

Aged plate precursors exposed with energies required for a good reproduction of 1-pixel elements were mounted in a sheet-fed offset lithographic press and proofed. The image areas accepted ink without any problems and the paper copies did not showed any toning in the non-image areas. After 150,000 good impressions the printing was stopped, however, the plates could have been used for more prints.

Example 4

A coating solution was prepared from the following components: 1.6 g of JONCRYL® 683; 1.6 g of Terpolymer; 0.72 g of dipentaerythritol pentaacrylate; 3.6 g of urethane acrylate; 0.2 g of (3,4-dimethoxyphenylthio)acetic acid; 0.15 g of 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3-H-indolium chloride; 0.35 g of 2-phenyl-4,6-bis(trichloromethyl)-1,3,5-triazine; 0.1 g of crystal violet; and 0.2 g of 5-mercapto-3-methylthio-1,2,4-thiadiazole (Synthec GmbH, Wolfen, Germany). Preparation and subsequent treatment of the plate precursors was performed as described in Example 1.

The results for energy requirements showed that for a good reproduction of the solids of a fresh precursor an exposure energy of 100 mJ/$cm^2$ and for 1-pixel elements one of 120 mJ/$cm^2$ was required. For a good reproduction of the solids, exposure energies of 115 mJ/$cm^2$ for dry aged precursor, and 120 mJ/$cm^2$ for wet aged precursor were required. For a good reproduction of 1-pixel elements exposures of 135 mJ/$cm^2$ (dry aged) and 135 mJ/$cm^2$ (wet aged) were needed. It is apparent by comparison with Example 1 that the exchange of the mercapto compound, the polymeric binder mixture, the carboxylic acid and the polyhaloalkyl-compound causes only an insignificant change in the infrared sensitivity of aged precursors compared to fresh precursors.

Example 5

The coating solution of Example 1 was modified by replacing 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride with 0.30 g dye IRT (Showa Denko K.K., Japan), which is a polymethine dyes, and replacing 3-mercapto-1,2,4-triazole with 2-mercapto-1-methylimidazole. The resulting composition was coated, imaged and processed as in Example 1. It was determined that for a fresh precursor 85 mJ/$cm^2$ for solids, 110 mJ/$cm^2$ for 1-pixel elements, for a dry aged precursor 90 mJ/$cm^2$ for solids, 120 mJ/$cm^2$ for 1-pixel elements, and for a wet aged precursor 90 mJ/$cm^2$ for solids and 120 mJ/$cm^2$ for 1-pixel elements were sufficient for a good reproduction.

Comparative Example 1 (Analogous to U.S. Pat. No. 6,309,792)

A coating solution was prepared from the following components: 3.0 g of JONCRYL® 683; 4.4 g of AC 50; 1.4 g of dipentaerythritol pentaacrylate; 8.4 g of urethane acrylate; 0.4 g of anilino diacetic acid; 0.25 g of 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; and 0.75 g of 2-(4-methoxyphenyl)-4,6-bis(trichloromethyl)-1,3,5-triazine; and 0.3 g of RENOL® Blue B2G HW. These components were dissolved under stirring in 100 mL of a mixture consisting of 30 parts by volume ethylene glycol monomethyl ether, 45 parts by volume methanol, and 25 parts by volume methyl ethyl ketone.

After the solution was filtered, it was applied to the substrate of Example 1 and the resulting element was dried for 4 min at 90° C. The dry weight of the resulting infrared-sensitive layer was about 2 g/$m^2$. An oxygen-impermeable barrier layer of 2.0 g/$m^2$ was applied as described in Example 1 and the precursors were dried for 5 min at 90° C. The precursors were aged as described in Example 1.

The infrared sensitivity and copy results of the precursors were then determined as described in Example 1. The unexposed areas of the precursors could be completely removed by the developer. The results for energy requirements showed that for a good reproduction of the solids, exposure energies of 78 mJ/$cm^2$ for fresh precursors, of 125 mJ/$cm^2$ for dry aged precursor, and 130 mJ/$cm^2$ for wet aged precursor were required. For a good reproduction of 1-pixel elements exposures of 107 mJ/$cm^2$ (fresh precursor), 155 mJ/$cm^2$ (dry aged precursor), and 160 mJ/$cm^2$ for wet aged precursor were needed.

These findings show that the absence of 3-mercapto-1,2,4-triazole in the composition leads to formulations which have the same sensitivity as fresh precursors, but which are however less stable when stored at higher temperatures and/or higher humidity conditions.

Comparative Example 2

Example 1 was repeated except that anilino diacetic acid was not added to the formulation, and the resulting composition was coated, imaged and processed as in Example 1.

The results for energy requirements showed that for a good reproduction of the solid image areas, exposure energies of 125 mJ/$cm^2$ for fresh precursors, of 140 mJ/$cm^2$ for dry aged precursor, and 140 mJ/$cm^2$ for wet aged precursor were required. For a good reproduction of 1-pixel elements, exposures of 160 mJ/$cm^2$ for the fresh precursor, and 175 mJ/$cm^2$ for dry aged precursor and 180 mJ/$cm^2$ for wet aged precursor were needed.

These findings show that the absence of a carboxylic acid leads to formulations that are less infrared sensitive. The shelf-life requirements of an infrared-sensitive printing precursor are however fulfilled, showing that even in this less-sensitive formulation the mercapto compound acts as a stabilizer.

Having described the invention, we now claim the following and their equivalents.

What is claimed is:

1. An infrared-sensitive composition comprising:

(i) an initiator system comprising:

(a) at least one compound capable of absorbing infrared radiation selected from the group consisting of triarylamine dyes, thiazolium dyes, indolium dyes, oxazolium dyes, cyanine dyes, polyaniline dyes, polypyrrole dyes, polythiophene dyes, and phthalocyanine pigments, (b) at least one compound capable of producing free radicals, the compound selected from polyhaloalkyl-substituted compounds, and (c) at least one carboxylic acid represented by formula (I):

$$R^4—(CR^5R^6)_n—Y—CH_2COOH \qquad (I)$$

in which:

Y is selected from the group consisting of O, S and $NR^7$;

$R^7$ is selected from the group consisting of hydrogen, $C_1$–$C_6$ alkyl, —$CH_2CH_2OH$, and $C_1$–$C_5$ alkyl substituted with —COOH;

$R^4$, $R^5$ and $R^6$ are each independently selected from the group consisting of hydrogen, $C_1$–$C_4$ alkyl, substituted or unsubstituted aryl, —COOH and —$NR^8CH_2COOH$;

$R^8$ is selected from the group consisting of —$CH_2COOH$, —$CH_2OH$, and —$(CH_2)_2N(CH_2COOH)_2$; and n is 0, 1, 2 or 3;

(ii) at least one component selected from unsaturated free radical-polymerizable monomers, unsaturated oligomers which are free radical-polymerizable, polymers containing free radical-polymerizable carbon-carbon double bonds in one or both of the backbone and a side chain, and mixtures thereof;

(iii) at least one polymeric binder; and (iv) a heterocyclic mercapto compound comprising an aromatic 5-membered heterocyclic ring with a thiol group substituted thereon, the ring comprising a nitrogen atom and at least one heteroatom selected from the group consisting of nitrogen, oxygen and sulfur, in which the heteroatom is separated in the ring from the nitrogen atom by one carbon atom, and in which the thiol group is bonded to the carbon atom;

in which:

$$ox_a < red_b + 1.6 \text{ eV},$$

in which $ox_a$ is the oxidation potential of component (a) in eV, and $red_b$ is the reduction potential of component (b) in eV.

2. The composition of claim 1 in which the compound capable of absorbing infrared radiation is a cyanine dye of the formula (A):

(A)

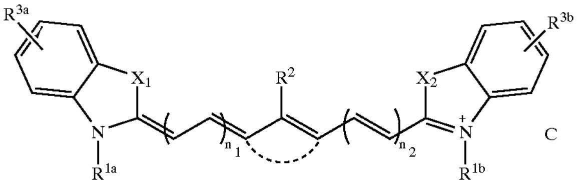

in which:

$X_1$ and $X_2$ are each independently S, O, NR or C(alkyl)$_2$;

$R^{1a}$ and $R^{1b}$ are each independently an alkyl group, an alkylsulfonate group, an alkylcarboxylate group or an alkylammonium group;

$R^2$ is hydrogen, halogen, SR, $SO_2R$, OR or $NR_2$;

$R^{3a}$ and $R^{3b}$ are each independently a hydrogen atom, an alkyl group, COOR, OR, SR, $NR_2$, a halogen atom, or a substituted or unsubstituted benzofused ring;

R is an alkyl group or an aryl group;

C is a counterion present in sufficient amount to achieve charge neutrality for cyanine dye (A);

is either two hydrogen atoms or a two-carbon or three-carbon chain; and $n_1$ and $n_2$ are each independently 0, 1, 2 or 3.

3. The composition of claim 1 in which the compound capable of producing radicals is 2-phenyl-4,6-bis(trichloromethyl)-1,3,5-triazine; 2-(4-methoxyphenyl)-4,6-bis(trichloromethyl)-1,3,5-triazine; tribromomethylphenylsulfone; 2,4,6-tris(trichloromethyl)- 1,3,5-triazine; or 1,2,3,4-tetrabromo-n-butane.

4. The composition of claim 1 in which the carboxylic acid is a compound of the formula (B)

(B)

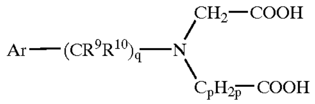

in which Ar is a mono-, poly- or unsubstituted aryl group, p is an integer from 1 to 5, $R^9$ and $R^{10}$ are independently selected from the group consisting of hydrogen and $C_1$–$C_4$ alkyl and q is 0 or an integer from 1 to 3; or a compound of the formula (C)

(C)

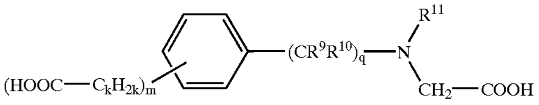

in which $R_{11}$ is a hydrogen atom or a $C_1$–$C_6$ alkyl group, k and m are each independently an integer from 1 to 5.

5. The composition of claim 1 in which the carboxylic acid is (3,4-dimethoxyphenylthio)acetic acid, anilino diacetic acid, or N-(carboxymethyl)-N-benzylglycine.

6. The composition of claim 1 in which the mercapto compound is selected from the group consisting of 3-mercapto-1,2,4-triazole; 2-mercaptobenzimidazole; 2-mercaptobenzoxazole; 5-mercapto-3-methylthio-1,2,4-thiadiazole; and 2-mercapto-1-methylimidazole.

7. The composition of claim 1 in which the polymeric binder has an acid number of >70 mg KOH/g.

8. The composition of claim 1 in which component (ii) is selected from the group consisting of pentaerythritol tetraacrylate, dipentaerythritol pentaacrylate, di(trimethylol propane) tetraacrylate, diethyleneglycol diacrylate, prepolymers comprising allyl alcohol ester groups, oligomeric urethane (meth)acrylates, and mixtures thereof.

9. The composition of claim 1 in which:

the at least one compound capable of absorbing infrared radiation is a cyanine dye or a mixture of cyanine dyes;

the carboxylic acid is selected from the group consisting of (3,4-dimethoxyphenylthio)acetic acid, anilino diacetic acid, and N-(carboxymethyl)-N-benzylglycine;

the compound capable of producing radicals is selected from the group consisting of 2-phenyl-4,6-bis(trichloromethyl)-1,3,5-triazine; 2-(4-methoxyphenyl)-4,6-bis(trichloromethyl)-1,3,5-triazine; tribromomethylphenylsulfone; 2,4,6-tris(trichloromethyl)-1,3,5-triazine; 1,2,3,4-tetrabromo-n-butane, and mixtures thereof;

the mercapto compound is selected from the group consisting of 3-mercapto-1,2,4-triazole; 2-mercaptobenzimidazole; 2-mercaptobenzoxazole; 5-mercapto-3-methylthio-1,2,4-thiadiazole; 2-mercapto-1-methylimidazole, and mixture thereof; and the polymeric binder has an acid number of >70 mg KOH/g.

10. A printing plate precursor comprising a printing plate substrate and a layer of an infrared-sensitive composition on the substrate, the infrared-sensitive composition comprising:

(i) an initiator system comprising:

(a) at least one compound capable of absorbing infrared radiation selected from the group consisting of triarylamine dyes, thiazolium dyes, indolium dyes, oxazolium dyes, cyanine dyes, polyaniline dyes, polypyrrole dyes, polythiophene dyes, and phthalocyanine pigments, (b) at least one compound capable of producing free radicals, the compound selected from polyhaloalkyl-substituted compounds, and (c) at least one carboxylic acid represented by formula (I):

$$R^4—(CR^5R^6)_n—Y—CH_2COOH \quad (I)$$

in which:

Y is selected from the group consisting of O, S and $NR^7$;

$R^7$ is selected from the group consisting of hydrogen, $C_1$–$C_6$ alkyl, $—CH_2CH_2OH$, and $C_1$–$C_5$ alkyl substituted with —COOH;

$R^4$, $R^5$ and $R^6$ are each independently selected from the group consisting of hydrogen, $C_1$–$C_4$ alkyl, substituted or unsubstituted aryl, —COOH and $—NR^8CH_2COOH$;

$R^8$ is selected from the group consisting of $—CH_2COOH$, $—CH_2OH$, and $—(CH_2)_2N(CH_2COOH)_2$; and n is 0, 1, 2 or 3;

(ii) at least one component selected from unsaturated free radical-polymerizable monomers, unsaturated oligomers which are free radical-polymerizable, polymers containing free radical-polymerizable carbon-carbon double bonds in one or both of the backbone and a side chain, and mixtures thereof;

(iii) at least one polymeric binder; and (iv) a heterocyclic mercapto compound comprising an aromatic 5-membered heterocyclic ring with a thiol group substituted thereon, the ring comprising a nitrogen atom and at least one heteroatom selected from the group consisting of nitrogen, oxygen and sulfur, in which the heteroatom is separated in the ring from the nitrogen atom by one carbon atom, and in which the thiol group is bonded to the carbon atom;

in which:

$$ox_a < red_b + 1.6 \text{ eV},$$

in which $ox_a$ is the oxidation potential of component (a) in eV, and $red_b$ is the reduction potential of component (b) in eV.

11. The printing plate precursor of claim 10 additionally comprising a substantially oxygen-impermeable barrier layer over the layer of infrared-sensitive composition.

12. The printing plate precursor of claim 10 in which the compound capable of absorbing infrared radiation is a cyanine dye of the formula (A):

(A)

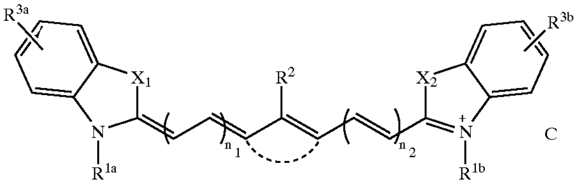

in which:

$X_1$ and $X_2$ are each independently S, O, NR or $C(alkyl)_2$;

$R^{1a}$ and $R^{1b}$ are each independently an alkyl group, an alkylsulfonate group, an alkylcarboxylate group or an alkylammonium group;

$R^2$ is hydrogen, halogen, SR, $SO_2R$, OR or $NR_2$;

$R^{3a}$ and $R^{3b}$ are each independently a hydrogen atom, an alkyl group, COOR, OR, SR, $NR_2$, a halogen atom, or a substituted or unsubstituted benzofused ring;

R is an alkyl group or an aryl group;

C is a counterion present in sufficient amount to achieve charge neutrality for cyanine dye (A);

is either two hydrogen atoms or a two-carbon or three-carbon chain; and $n_1$ and $n_2$ are each independently 0, 1, 2 or 3.

13. The printing plate precursor of claim 10 in which the compound capable of producing radicals is 2-phenyl-4,6-bis(trichloromethyl)-1,3,5-triazine; 2-(4-methoxyphenyl)-4,6-bis(trichloromethyl)-1,3,5-triazine; tribromomethylphenylsulfone; 2,4,6-tris(trichloromethyl)-1,3,5-triazine; or 1,2,3,4-tetrabromo-n-butane.

14. The printing plate precursor of claim 10 in which the carboxylic acid is a compound of the formula (B)

(B)

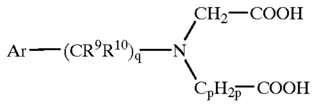

in which Ar is a mono-, poly- or unsubstituted aryl group, p is an integer from 1 to 5, $R^9$ and $R^{10}$ are independently selected from the group consisting of hydrogen and $C_1$–$C_4$ alkyl and q is 0 or an integer from 1 to 3; or of a compound of the formula (C)

(C)

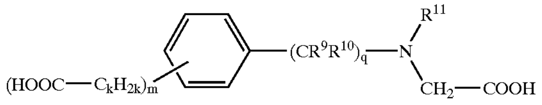

in which $R_{11}$ is a hydrogen atom or a $C_1$–$C_6$ alkyl group, k and m are each independently an integer from 1 to 5.

15. The printing plate precursor of claim 10 in which the carboxylic acid is (3,4-dimethoxyphenylthio)acetic acid, anilino diacetic acid, or N-(carboxymethyl)-N-benzylglycine.

16. The printing plate precursor of claim 10 in which the mercapto compound is selected from the group consisting of 3-mercapto-1,2,4-triazole; 2-mercaptobenzimidazole; 2-mercaptobenzoxazole; 5-mercapto-3-methylthio-1,2,4-thiadiazole; and 2-mercapto-1-methylimidazole.

17. The printing plate precursor of claim 10 in which the polymeric binder has an acid number of >70 mg KOH/g.

18. The printing plate precursor of claim 10 in which:

the at least one compound capable of absorbing infrared radiation is a cyanine dye or a mixture of cyanine dyes;

the carboxylic acid is selected from the group consisting of (3,4-dimethoxyphenylthio)acetic acid, anilino diacetic acid, and N-(carboxymethyl)-N-benzylglycine;

the compound capable of producing radicals is selected from the group consisting of 2-phenyl-4,6-bis(trichloromethyl)-1,3,5-triazine; 2-(4-methoxyphenyl)-4,6-bis(trichloromethyl)-1,3,5-triazine; tribromomethylphenylsulfone; 2,4,6-tris(trichloromethyl)-1,3,5-triazine; 1,2,3,4-tetrabromo-n-butane, and mixtures thereof;

the mercapto compound is selected from the group consisting of 3-mercapto-1,2,4-triazole; 2-mercaptobenzimidazole; 2-mercaptobenzoxazole; 5-mercapto-3-methylthio-1,2,4-thiadiazole; 2-mercapto-1-methylimidazole, and mixtures thereof; and the polymeric binder has an acid number of >70 mg KOH/g.

19. A method for producing a lithographic printing plate precursor, comprising applying a layer of an infrared-sensitive composition to a substrate, the infrared sensitive composition comprising:

(i) an initiator system comprising:

(a) at least one compound capable of absorbing infrared radiation selected from the group consisting of triarylamine dyes, thiazolium dyes, indolium dyes, oxazolium dyes, cyanine dyes, polyaniline dyes, polypyrrole dyes, polythiophene dyes, and phthalocyanine pigments, (b) at least one compound capable of producing free radicals, the compound selected from polyhaloalkyl-substituted compounds, and (c) at least one carboxylic acid represented by formula (I):

$$R^4—(CR^5R^6)_n—Y—CH_2COOH \quad (I)$$

in which:

Y is selected from the group consisting of O, S and $NR^7$;

$R^7$ is selected from the group consisting of hydrogen, $C_1$–$C_6$ alkyl, —$CH_2CH_2OH$, and $C_1$–$C_5$ alkyl substituted with —COOH;

$R^4$, $R^5$ and $R^6$ are each independently selected from the group consisting of hydrogen, $C_1$–$C_4$ alkyl, substituted or unsubstituted aryl, —COOH and —$NR^8CH_2COOH$;

$R^8$ is selected from the group consisting of —$CH_2COOH$, —$CH_2OH$, and —$(CH_2)_2N(CH_2COOH)_2$; and n is 0, 1, 2 or 3;

(ii) at least one component selected from unsaturated free radical-polymerizable monomers, unsaturated oligomers which are free radical-polymerizable, polymers containing free radical-polymerizable carbon-carbon double bonds in one or both of the backbone and a side chain, and mixtures thereof;

(iii) at least one polymeric binder; and (iv) a heterocyclic mercapto compound comprising an aromatic 5-membered heterocyclic ring with a thiol group substituted thereon, the ring comprising a nitrogen atom and at least one heteroatom selected from the group consisting of nitrogen, oxygen and sulfur, in which the heteroatom is separated in the ring from the nitrogen atom by one carbon atom, and in which the thiol group is bonded to the carbon atom;

in which:

$$ox_a < red_b + 1.6 \text{ eV},$$

in which $ox_a$ is the oxidation potential of component (a) in eV, and $red_b$ is the reduction potential of component (b) in eV.

20. The method of claim 19 additionally comprising applying a substantially oxygen-impermeable barrier layer over the layer of the infrared-sensitive composition.

21. A method for producing a lithographic printing plate, comprising:

(A) providing a lithographic printing plate precursor comprising a layer of an infrared-sensitive composition over a substrate, the infrared-sensitive composition comprising:

(i) an initiator system comprising:

(a) at least one compound capable of absorbing infrared radiation selected from the group consisting of triarylamine dyes, thiazolium dyes, indolium dyes, oxazolium dyes, cyanine dyes, polyaniline dyes, polypyrrole dyes, polythiophene dyes, and phthalocyanine pigments, (b) at least one compound capable of producing free radicals, the compound selected from polyhaloalkyl-substituted compounds, and (c) at least one carboxylic acid represented by formula (I):

$$R^4—(CR^5R^6)_n—Y—CH_2COOH \quad (I)$$

in which:

Y is selected from the group consisting of O, S and $NR^7$;

$R^7$ is selected from the group consisting of hydrogen, $C_1$–$C_6$ alkyl, —$CH_2CH_2OH$, and $C_1$–$C_5$ alkyl substituted with —COOH;

$R^4$, $R^5$ and $R^6$ are each independently selected from the group consisting of hydrogen, $C_1$–$C_4$ alkyl, substituted or unsubstituted aryl, —COOH and —$NR^8CH_2COOH$;

$R^8$ is selected from the group consisting of —$CH_2COOH$, —$CH_2OH$, and —$(CH_2)_2N(CH_2COOH)_2$; and n is 0, 1, 2 or 3;

(ii) at least one component selected from unsaturated free radical-polymerizable monomers, unsaturated oligomers which are free radical-polymerizable, polymers containing free radical-polymerizable carbon-carbon double bonds in one or both of the backbone and a side chain, and mixtures thereof;

(iii) at least one polymeric binder; and (iv) a heterocyclic mercapto compound comprising an aromatic 5-membered heterocyclic ring with a thiol group substituted thereon, the ring comprising a nitrogen atom and at least one heteroatom selected from the group consisting of nitrogen, oxygen and sulfur, in which the heteroatom is separated in the ring from the nitrogen atom by one carbon atom, and in which the thiol group is bonded to the carbon atom;

in which:

$$ox_a < red_b + 1.6\ eV,$$

in which $ox_a$ is the oxidation potential of component (a) in eV, and $red_b$ is the reduction potential of component (b) in eV;

(B) imagewise exposing the precursor to infrared radiation to form an imagewise-exposed precursor comprising exposed and unexposed regions in the layer of infrared sensitive composition, and (C) developing the imagewise-exposed precursor with a developer to remove said unexposed regions and leave said exposed regions.

22. The method of claim 21 in which the precursor additionally comprises a substantially oxygen-impermeable barrier layer over the layer of the infrared-sensitive composition.

23. The method of claim 21 additionally comprising heating the imagewise exposed precursor before step (C).

24. A printing plate obtained by the method of claim 21.

25. The printing plate of claim 24 in which the precursor additionally comprises a substantially oxygen-impermeable barrier layer over the layer of the infrared-sensitive composition.

26. A printing plate obtained by the method of claim 23.

* * * * *

UNITED STATES PATENT AND TRADEMARK OFFICE

CERTIFICATE OF CORRECTION

PATENT NO. : 6,884,568 B2

DATED : April 26, 2005

INVENTOR(S) : Hans-Joachim Timpe, Tobias Wittig and Ursula Müller

It is certified that error appears in the above-identified patent and that said Letters Patent is hereby corrected as shown below:

Column 1,
Line 8, delete "now abandoned"

Signed and Sealed this

Twelfth Day of July, 2005

JON W. DUDAS
*Director of the United States Patent and Trademark Office*